(12) United States Patent
Lof et al.

(10) Patent No.: US 7,274,029 B2
(45) Date of Patent: Sep. 25, 2007

(54) LITHOGRAPHIC APPARATUS AND DEVICE MANUFACTURING METHOD

(75) Inventors: Joeri Lof, Eindhoven (NL); Joannes Theodoor De Smit, Eindhoven (NL)

(73) Assignee: ASML Netherlands B.V. (NL)

( * ) Notice: Subject to any disclaimer, the term of this patent is extended or adjusted under 35 U.S.C. 154(b) by 0 days.

(21) Appl. No.: 11/022,923

(22) Filed: Dec. 28, 2004

(65) Prior Publication Data

US 2006/0138358 A1 Jun. 29, 2006

(51) Int. Cl.
*G21K 5/10* (2006.01)
*H01J 37/08* (2006.01)

(52) U.S. Cl. .................... 250/492.22; 250/492.23; 250/548; 355/53; 355/67

(58) Field of Classification Search .............. None
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2004/0189970 A1* | 9/2004 | Takada | 355/67 |
| 2005/0007572 A1 | 1/2005 | George et al. | |

FOREIGN PATENT DOCUMENTS

WO  WO 98/33096  7/1998
WO  WO 98/38597  9/1998

* cited by examiner

*Primary Examiner*—David Vanore
(74) *Attorney, Agent, or Firm*—Sterne, Kessler, Goldstein & Fox PLLC

(57) ABSTRACT

A projection system comprises an array of lenses MLA, each lens transmitting a unique part of a patterned beam. Measuring devices measure a distance between the array of lenses MLA and a substrate W. A controller controls an actuator to adjust a position (e.g., height and/or tilt) of the microlens array MLA.

17 Claims, 2 Drawing Sheets

Scan direction

LITHOGRAPHIC APPARATUS AND DEVICE MANUFACTURING METHOD

BACKGROUND

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays, and other devices involving fine structures. In a conventional lithographic apparatus, a patterning device, which is alternatively referred to as a mask or a reticle, can be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (e.g., resist).

Instead of a mask, the patterning device can comprise an array of individually controllable elements that serve to generate the circuit pattern. This is known as a maskless lithographic apparatus. An array of lenses can be arranged perpendicularly to the direction of propagation of the projection beam, each lens transmitting and focusing a unique part of the projection beam onto the substrate. This is known as a micro lens array (MLA).

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

As discussed above, a lithographic apparatus can be used to image flat panel displays or micro electromechanical systems. Changes in the thickness of the substrate can lead to inaccuracies in the exposure of the substrate. In order to rectify this situation either the position of the individually controllable elements or the position of the microlens array has to be changed.

Therefore, what is needed is a system and method that provides an improved apparatus for controlling a distance between a substrate and a microlens array.

SUMMARY

According to one embodiment of the present invention, there is provided a lithographic apparatus comprising an illumination system, an array of individually controllable elements, a projection system, a measuring device, and an actuating system. The illumination system is configured to condition a radiation beam. The array of individually controllable elements patterns the radiation beam. The projection system projects the patterned radiation beam onto a target portion of the substrate, and comprises an array of lenses arranged in a plane, such that each lens transmits a different part of the radiation beam. The measuring device measures the distance between a part of the substrate and a part of the array of lenses. The actuating system adjusts at least one of a position and a tilt of the whole array of lenses based on measurements by the measuring device.

According to another embodiment of the present invention, there is provided a device manufacturing method comprising the following steps. Patterning beam of radiation using an array of individually controllable elements. Projecting the patterned beam of radiation onto a target portion of a substrate using a projection system, which comprises at least array of lenses arranged in a plane, such that each lens transmits a different part of the radiation beam. Measuring a distance between the substrate and the array of lenses. Adjusting the position and/or tilt of the array of lenses based on the measured distance.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION

Overview and Terminology

Figure 1:
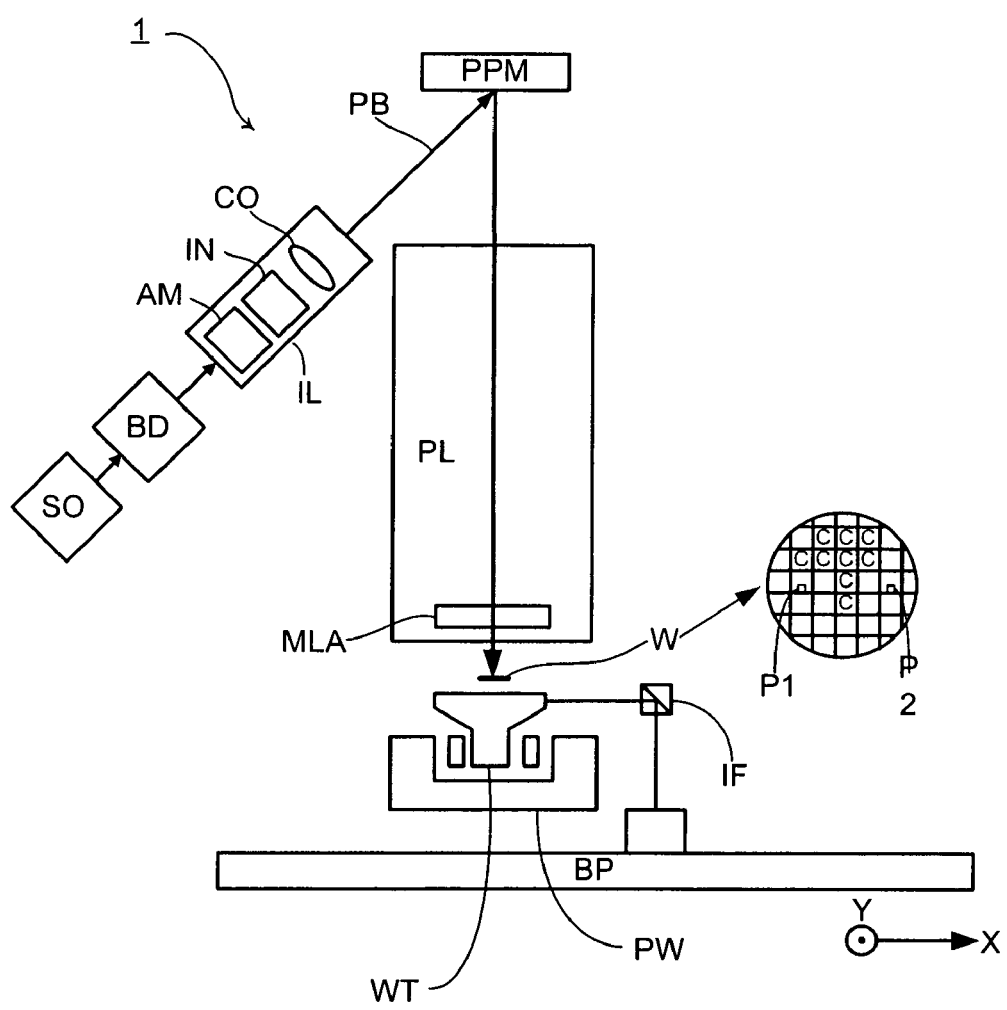
FIG. 1 depicts a lithographic apparatus according to an embodiment of the invention.

Although specific reference can be made in this text to the use of lithographic apparatus in the manufacture of integrated circuits (ICs), it should be understood that the lithographic apparatus described herein can have other applications, such as the manufacture of the manufacture of DNA chips, MEMS, MOEMS, integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the filter can filter out the diffracted light, leaving the undiffracted light to reach the substrate. In this manner, the beam becomes patterned according to the addressing pattern of the matrix-addressable surface. It will be appreciated that, as an alternative, the undiffracted light can be filtered out of the reflected beam, leaving only the diffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. A programmable LCD array can also be used. It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Exemplary Lithographic Projection Tools

FIG. 1 schematically depicts a lithographic projection apparatus, according to one embodiment of the present invention. The apparatus comprises an illumination system IL, an array of individually controllable elements PPM, a substrate table WT, and a projection system ("lens") PL. The illumination system (e.g., illuminator) IL provides a projection beam PB of radiation (e.g., UV radiation). The array of individually controllable elements PPM (e.g., a programmable mirror array) applies a pattern to the projection beam; in general the position of the array of individually controllable elements will be fixed relative to item PL. However, it can instead be connected to a positioning means for accurately positioning it with respect to item PL. The substrate table (e.g., a wafer table) WT for supporting a substrate (e.g., a resist-coated glass or wafer) W, and connected to positioning means PW for accurately positioning the substrate with respect to item PL. The projection system ("lens") PL images a pattern imparted to the projection beam PB by the array of individually controllable elements PPM onto a target portion C (e.g., comprising one or more dies) of the substrate W. The projection system can image the array of individually controllable elements onto the substrate. Alternatively, the projection system can image secondary sources for which the elements of the array of individually controllable elements act as shutters.

As here depicted, the apparatus is of a reflective type (i.e., has a reflective array of individually controllable elements). However, in general, it can also be of a transmissive type, for example with a transmissive array of individually controllable elements.

The illuminator IL receives a beam of radiation from a radiation source SO. The source and the lithographic apparatus can be separate entities. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source can be integral part of the apparatus, for example when the source is a frequency tripled Nd:YAG laser. The source SO and the illuminator IL, together with the beam delivery system BD if required, can be referred to as a radiation system.

The illuminator IL can comprise adjusting means AM the for setting a zoom to adjust a spot size of beam or for adjusting angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired zoom, spot size, uniformity, and intensity distribution in its cross section.

The beam PB subsequently intercepts the array of individually controllable elements PPM. Having been reflected by the array of individually controllable elements PPM, the beam PB passes through the projection system PL, which focuses the beam PB onto a target portion C of the substrate W. With the aid of the positioning means PW (and position measuring means, for example, interferometric measuring means IF), the substrate table WT can be moved accurately, e.g., so as to position different target portions C in the path of the beam PB. Where used, the positioning means for the array of individually controllable elements can be used to accurately correct the position of the array of individually controllable elements PPM with respect to the path of the beam PB, e.g., during a scan.

In general, movement of the object table WT is realized with the aid of a long-stroke module (course positioning) and a short-stroke module (fine positioning), which are not explicitly depicted in FIG. 1. A similar system can also be used to position the array of individually controllable elements.

It will be appreciated that the projection beam can alternatively/additionally be moveable, while the object table and/or the array of individually controllable elements can have a fixed position to provide the required relative movement.

As a further alternative, that can be especially applicable in the manufacture of flat panel displays, the position of the substrate table and the projection system can be fixed and the substrate can be arranged to be moved relative to the substrate table. For example, the substrate table can be provided with a system for scanning the substrate across it at a substantially constant velocity.

Although the lithography apparatus according to the invention is herein described as being for exposing a resist on a substrate, it will be appreciated that the invention is not limited to this use and the apparatus can be used to project a patterned projection beam for use in resistless lithography.

The depicted apparatus can be used in at least five modes:

1. Step mode: the array of individually controllable elements imparts an entire pattern to the projection beam, which is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the array of individually controllable elements is movable in a given direction (the so-called "scan direction," e.g., the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

4. Continuous scan mode: essentially the same as pulse mode except that a substantially constant radiation source is used and the pattern on the array of individually controllable elements is updated as the projection beam scans across the substrate and exposes it.

5. Pixel Grid Imaging Mode: the pattern formed on a substrate is realized by subsequent exposure of spots formed by a spot generator that are directed onto an array of individually controllable elements. The exposed spots have substantially the same shape. On the substrate the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

The projection system can also comprise an array of focusing elements, such as a microlens array (known as an MLA) or a Fresnel lens array e.g., (hereinafter, all referred to as an MLA) to form the secondary sources and to image microspots onto the substrate. Each individually controllable element can have a corresponding lens in the MLA or the portion of the patterned beam from several individually controllable elements can be projected onto the substrate by a single lens in the MLA. Alternatively, the patterned beam from a single individually controllable element can be projected onto a plurality of lenses in the microlens array MLA.

Figure 2:
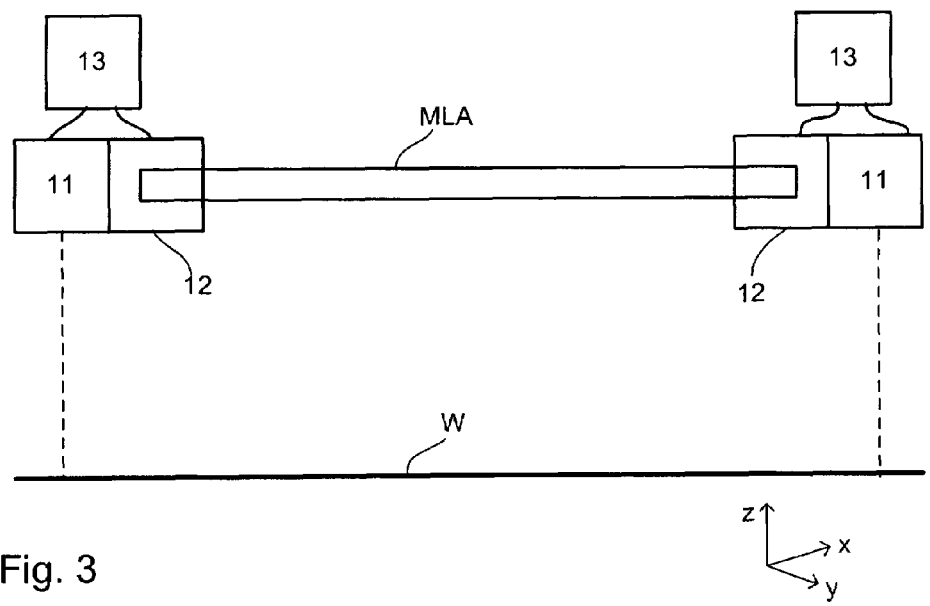
FIGS. 2 and 3 show a side and top view, respectively, of detecting elements adjoining an array of lenses, according to one embodiment of the present invention.

FIG. 2 shows detecting elements 11 adjoining an array of lenses MLA, according to one embodiment of the present invention. Detecting elements 11 detect the distance between the MLA and the substrate W. In one example, detecting elements 11 are contactless distance sensors so the substrate W is free to move unhindered. The measuring device 11 can be, for example, capacitive, optical, acoustical, pneumatic, or the like. Data from the detecting elements 11 is fed to a controller 13, which controls actuator 12. In this example, each of the detecting elements 111 has a corresponding controller 13 and actuating device 12.

Figure 3:
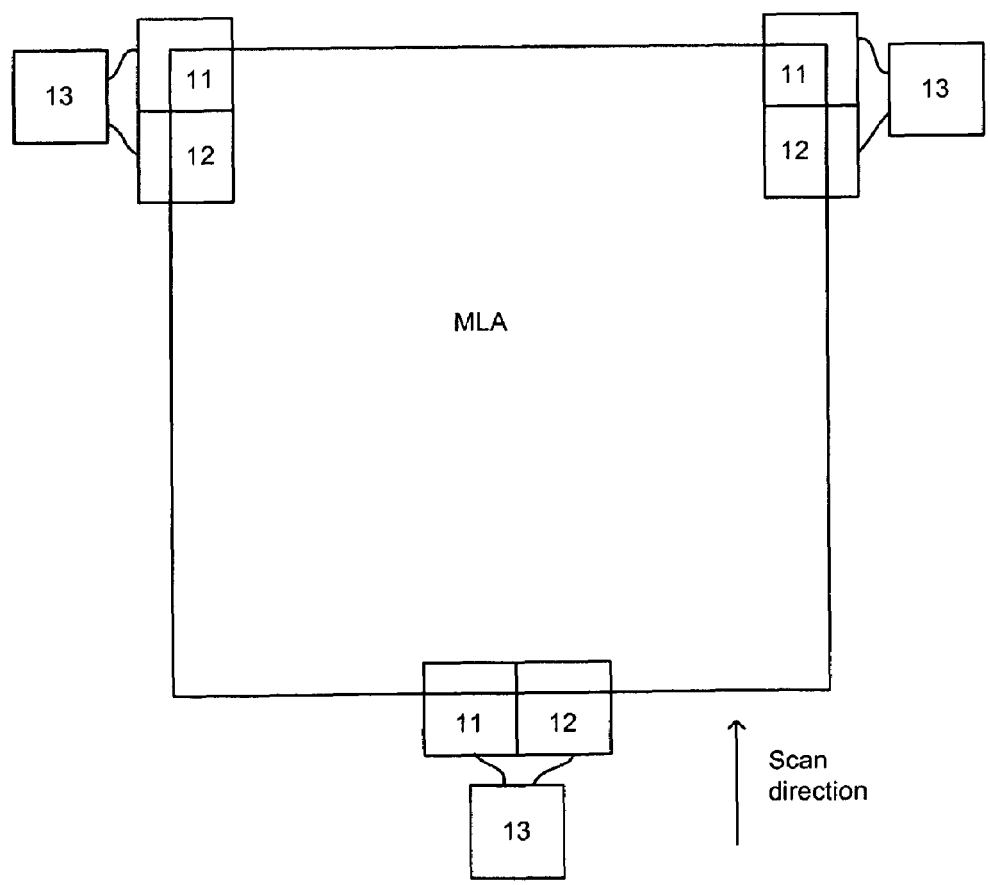

FIG. 3 shows a top view of FIG. 2, according to one embodiment of the present invention. In this example, there are three measuring devices 11, controllers 13, and actuating devices 12. This allows a good versatility of adjustment of the microlens array MLA. In particular, this gives three degrees of freedom. In one example, the actuators 12 and measuring devices 11 are arranged in a triangular shape rather than in a linear fashion. However, any number of measuring devices 11 and actuating devices 12 can be used. The actuating devices 12 can be actuated in at least three directions: z, Rx and Ry. In another example, they can be actuated in the x, y and Rz directions.

In one example, data collected by one measuring device 11 can be used to control multiple actuators. In one example, a number of detectors can be used to map the surface of the substrate and the actuators used to follow this map. The actuators can be used to tilt the substrate or bend the substrate to best fit the mapped surface.

In the example shown in FIG. 3, measuring of the substrate W takes place "on the fly." Thus measuring devices 11 substantially simultaneously measure the distance between the microlens array MLA and the substrate W, while the substrate is being processed, e.g., exposed. There can be irregularities in the surface of the substrate W to be exposed resulting in an uneven thickness and surface. Measuring device 11 measures the distance between the microlens array MLA and the surface of substrate W at a particular point. This data is fed to controller 13 and if the distance is smaller than a predetermined level actuator 12 increases the distance between the microlens array MLA and the substrate W. In conjunction with data from the other measuring devices 1 it is possible to detect a tilt in the substrate W. If a tilt in substrate W is detected actuating devices 12 can be used to change the tilt of the microlens array MLA. Changing at least one of the position and tilt of the microlens array MLA is simpler than changing the position and/or tilt of the substrate W as it is lighter and easier to manoeuvre. Accuracies of smaller than about 1 μm can be achieved by this method.

In one example, if the measuring takes place "on the fly," as described above, any movement or tilt of the substrate will be compensated for resulting in a more accurate exposure. Thus, in this example, the substrate table holding the substrate W does not need to be manufactured to such a high specification as the "on the fly" measurement can compensate for imperfections. This measurement and actuation system is both simple and cheap to implement.

As can be seen in FIG. 3, the measuring devices 11 are arranged around the periphery of the microlens array MLA. Thus, when the substrate is being scanned data from a particular point on the substrate is only used when it is part of the target portion of the substrate C. There can therefore be a small time delay between collecting a piece of data and use of a piece of data.

In one example, when the edge of a substrate is exposed, at least one of the sensors will not be directly above the substrate. Data from such a measuring device 11 should not be used, and the feedback loop switch off. Data to be used by the corresponding actuator 12 can be obtained by, for example, extrapolation or feed forward.

Although the example above illustrates "on the fly" measurement, in another example the measurements could be taken prior to any processing of the substrate W. For example, all measuring devices 11 can detect the distance between the microlens array MLA and substrate W to map the substrate. This data can then be stored in controllers 13 to be used when the substrate is being processed. Controller 13 can also change the height of the microlens array MLA for other reasons.

Although the microlens array has been described as forming a part of the projection system PL, in other examples it could equally well be separate from the projection system PL.

In one example, the detecting elements 11 could be fixed to the MLA (i.e. moving up and down with the MLA) working in a feed back system and keeping the measured distance as close as possible to a predetermined value. In another example, the detecting elements 11 could be independent from the MLA and measure the distance to the substrate. The information gathered is fed to the controller 13 (and thus the actuator 12) in a feed forward method.

Although the invention has been described in conjunction with a single array of individually controllable elements, in other examples there can be a plurality of arrays of individually controllable elements. Similarly, there can be a plurality of arrays of individually controllable elements. Similarly, there can be a plurality of arrays of microlenses.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A lithographic apparatus, comprising:
   an illumination system that conditions a radiation beam;
   an array of individually controllable elements that pattern the beam;
   a projection system that projects the patterned beam onto a target portion of a substrate and comprising an array of lenses arranged in a plane, such that each lens transmits a different part of the patterned beam;
   a measuring device that measures a distance between a part of the substrate and a part of the array of lenses, the distance being measured perpendicular to the substrate; and
   an actuator that adjusts a position of the array of lenses based on measurements by the measuring device wherein the adjusted position is substantially perpendicular to the plane.

2. The apparatus of claim 1, further comprising:
   a plurality of the measuring devices, each of the measuring devices measuring a respective one of the distances between a different part of the substrate and a different part of the array of lenses.

3. The apparatus of claim 2, wherein the plurality of the measuring devices comprises three of the measuring devices.

4. The apparatus of claim 1, wherein the actuator adjusts the array of lenses to adjust a position of a plurality of points on the substrate.

5. The apparatus of claim 4, further comprising:
a plurality of the measuring devices; and
a plurality of the actuators,
wherein each of the measuring devices has a corresponding one of the actuators.

6. The apparatus of claim 1, further comprising:
a plurality of the measuring devices;
a plurality of the actuators; and
wherein data from each of the measuring devices is used to control a corresponding one of the actuators.

7. The apparatus of claim 1, wherein the measuring device measures the distance between the substrate and the array of lenses when the substrate is in a position to be exposed by the patterned beam.

8. The apparatus of claim 1, further comprising:
a storage element that stores data regarding the measured distance between the substrate and the array of lenses.

9. The apparatus of claim 1, wherein the measuring device is a contactless distance sensor.

10. The apparatus of claim 1, wherein the actuator adjusts in three degrees of freedom.

11. The apparatus of claim 1, wherein the actuator bends the array of lenses based on measurements by the measuring device.

12. The apparatus of claim 1, wherein the measuring device is fixed to the array of lenses and moves with the array of lenses.

13. The apparatus of claim 1, wherein the measuring device is independent from the array of lenses.

14. A device manufacturing method, comprising:
(a) patterning a beam of radiation using an array of individually controllable elements;
(b) projecting the patterned beam onto a target portion of a substrate using a projection system;
(c) arranging an array of lenses arranged in a plane of the projection system, such that each lens in the array of lenses transmits a different part of the patterned beam;
(d) measuring a distance between the substrate and the array of lenses, the distance being measured perpendicular to the substrate; and
(e) adjusting a position of the array of lenses based on the measured distance wherein the adjusted position is substantially perpendicular to the plane.

15. The device manufacturing method according to claim 14, wherein steps (d) and (e) occur at substantially a same time for the substrate.

16. A method according to claim 14 wherein steps (d) and (e) occur at different times.

17. A lithographic apparatus, comprising:
an illumination system that conditions a radiation beam;
an array of individually controllable elements that pattern the beam;
a projection system that projects the patterned beam onto a target portion of a substrate and comprising an array of lenses arranged in a plane, such that each lens transmits a different part of the patterned beam;
a measuring device that measures a distance parallel to the beam between the substrate and the array of lenses; and
an actuator that adjusts a position of the array of lenses based on the measured distance wherein the adjusted position is substantially perpendicular to the plane.

* * * * *